(12) United States Patent
Wright

(10) Patent No.: US 6,509,201 B1
(45) Date of Patent: Jan. 21, 2003

(54) METHOD AND APPARATUS FOR MONITORING WAFER STRESS

(75) Inventor: Marilyn I. Wright, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/832,697

(22) Filed: Apr. 11, 2001

(51) Int. Cl.[7] .......................... H01L 21/66; G01R 31/26
(52) U.S. Cl. .................... 438/16; 438/14; 438/7; 716/4
(58) Field of Search .................. 438/7, 14, 16, 438/89; 716/4, 5, 6, 17; 356/451, 452, 453, 454, 455, 456

(56) References Cited

U.S. PATENT DOCUMENTS

| | | | | |
|---|---|---|---|---|
| 5,220,403 A | * | 6/1993 | Batchelder et al. | ......... 356/450 |
| 6,051,348 A | | 4/2000 | Marinaro et al. | ............. 430/30 |
| 6,096,091 A | * | 8/2000 | Hartmann | ..................... 716/17 |
| 6,182,247 B1 | * | 1/2001 | Herrmann et al. | ............. 716/4 |
| 6,245,584 B1 | | 6/2001 | Marinaro et al. | ............. 438/14 |
| 6,304,999 B1 | * | 10/2001 | Toprac et al. | ................... 716/4 |
| 6,413,321 B1 | * | 7/2002 | Kim et al. | .................. 438/680 |
| 6,458,610 B1 | * | 10/2002 | Lensing et al. | ............... 438/16 |

* cited by examiner

*Primary Examiner*—Kevin M. Picardat
(74) *Attorney, Agent, or Firm*—Williams, Morgan & Amerson, P.C.

(57) ABSTRACT

The present invention provides for a method and an apparatus for characterizing wafer stress. At least one semiconductor device is processed. Metrology data from the processed semiconductor device is acquired. Micro-Raman data relating to the processed semiconductor device is acquired. A wafer-stress analysis based upon the metrology data and the micro-Raman data is performed. A feedback process based upon the wafer stress analysis is performed.

37 Claims, 7 Drawing Sheets

METHOD AND APPARATUS FOR MONITORING WAFER STRESS

BACKGROUND OF THE INVENTION

1. Field of the Invention

This invention relates generally to semiconductor manufacturing, and, more particularly, to a method and apparatus for monitoring film stress during a semiconductor manufacturing process.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variation that are caused by manufacturing problems that include start-up effects of manufacturing machine tools, memory effects of manufacturing chambers, and first-wafer effects. One of the process steps that is adversely affected by such factors is the photolithography overlay process. Overlay is one of several important steps in the photolithography area of semiconductor manufacturing. Overlay control involves measuring the misalignment between two successive patterned layers on the surface of a semiconductor device. Generally, minimization of misalignment errors helps ensure that the multiple layers of the semiconductor devices are connected and functional. As technology facilitates smaller critical dimensions for semiconductor devices, the need for reduced misalignment errors increases dramatically.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner. Furthermore, wafer-to-wafer manufacturing variations can cause non-uniform quality of semiconductor devices.

A known technique for evaluating the acceptability of the photolithography and other processes involves measuring critical dimensions or other parameters after the process is performed. However, variations in film stress on a semiconductor wafer can reduce the accuracy of measurements. Furthermore, variations in film stress can reduce the predictability of the compensation steps that are taken to reduce errors in manufacturing processes.

The present invention is directed to overcoming, or at least reducing the effects of, one or more of the problems set forth above.

SUMMARY OF THE INVENTION

In one aspect of the present invention, a method is provided for characterizing wafer stress. At least one semiconductor device is processed. Metrology data from the processed semiconductor device is acquired. Micro-Raman data relating to the processed semiconductor device is acquired. A wafer-stress analysis based upon the metrology data and the micro-Raman data is performed. A feedback process based upon the wafer stress analysis is performed.

In another aspect of the present invention, a system is provided for characterizing wafer stress. The system of the present invention comprises: a computer system; a manufacturing model coupled with the computer system, the manufacturing model being capable of generating and modifying at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; a metrology data analysis unit coupled with the metrology, the metrology data analysis unit being capable of organizing the acquired metrology data; a micro-Raman data acquisition unit coupled to the processing tool, the micro-Raman data acquisition unit being capable of acquiring micro-Raman data relating to the semiconductor wafers; and a correlator coupled to the micro-Raman data acquisition unit and the metrology data analysis unit, the correlator being capable of consolidating the metrology data and the micro-Raman data to perform a corrective feedback function for a manufacturing process based upon a wafer stress calculation performed using the consolidated data.

BRIEF DESCRIPTION OF THE DRAWINGS

The invention may be understood by reference to the following description taken in conjunction with the accompanying drawings, in which like reference numerals identify like elements, and in which.

Figure 1:
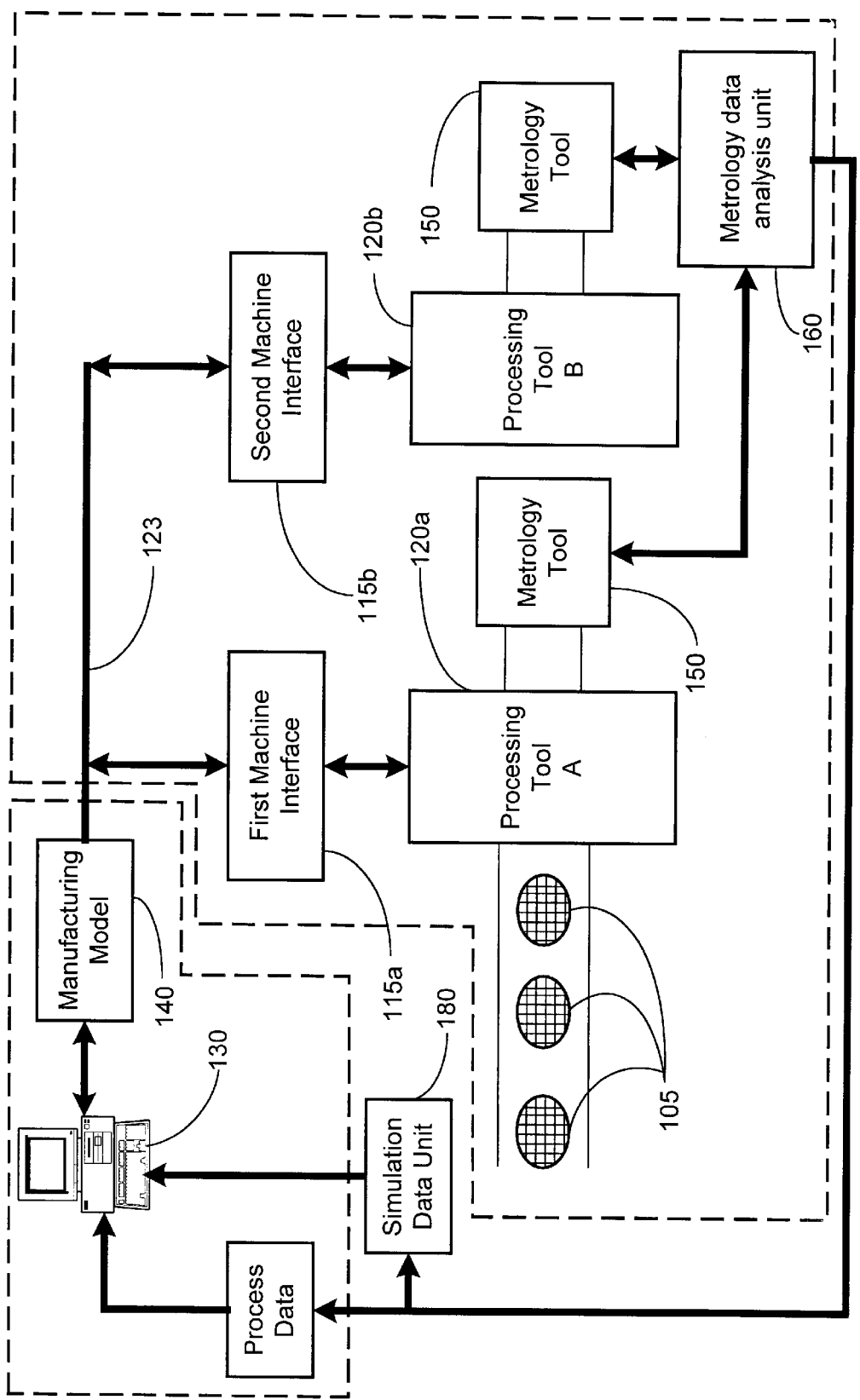
FIG. 1 illustrates a system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Wafer-to-wafer and wafer-lot to wafer-lot variations can result in an output of non-uniform semiconductor devices. Furthermore, attempts to overcome wafer errors during manufacturing can be adversely affected by variations in stress levels, such as film stress levels, on wafers. Embodiments of the present invention utilize scatterometer and micro-Raman techniques to measure and predict stress levels on semiconductor wafers. Furthermore, embodiments of the present invention provide techniques to detect wafer stress levels in an inline (i.e., in the assembly line during manufacturing processes) fashion.

Semiconductor devices are processed in a manufacturing environment using a number of input control parameters. Turning now to FIG. 1, a system 100 in accordance with one embodiment of the present invention is illustrated. In one embodiment, semiconductor products, such as semiconductor wafers 105, are processed on processing tools 110a, 110b using a plurality of control input signals, or manufacturing parameters, on a line 123. In one embodiment, control input signals, or process signals, on the line 123 are sent to the processing tools 110a, 110b from a computer system 130 via machine interfaces 115a, 115b. In one embodiment, the first and second machine interfaces 115a, 115b are located outside the processing tools 110a, 110b. In an alternative embodiment, the first and second machine interfaces 115a, 115b are located within the processing tools 110a, 110b.

In one embodiment, the computer system 130 sends control input signals, or manufacturing parameters, on the line 123 to the first and second machine interfaces 115a, 115b. The computer system 130 employs a manufacturing model 140 to generate the control input signals on the line 123. In one embodiment, the manufacturing model 140 contains a manufacturing recipe that determines a plurality of control input parameters that are sent on the line 123.

In one embodiment, the manufacturing model 140 defines a process script and input control that implement a particular manufacturing process. The control input signals on the line 123 that are intended for processing tool A 120a are received and processed by the first machine interface 115a. The control input signals on the line 123 that are intended for processing tool B 120b are received and processed by the second machine interface 115b. Examples of the processing tools 120a, 120b used in semiconductor manufacturing processes are steppers, scanners, step-and-scan tools, etch process tools, and the like. In one embodiment, processing tool A 120a and processing tool B 120b are photolithography process tools, such as steppers.

One or more of the semiconductor wafers 105 that are processed by the processing tools 110a, 110b can also be sent to a metrology tool 150 for acquisition of metrology data. The metrology tool 150 can be a scatterometry data acquisition tool, an overlay-error measurement tool, a critical dimension measurement tool, and the like. In one embodiment, one or more processed semiconductor wafers are examined by a metrology tool 150. Data from the metrology tool 150 is collected by a metrology data analyzer unit 160. The metrology data analyzer unit 160 organizes, analyses, and correlates scatterometry metrology data acquired by the metrology tool 150, to particular semiconductor wafers 105 that were examined. The metrology data analyzer unit 160 can be a software unit, a hardware unit, or a firmware unit. In one embodiment, the metrology data analyzer unit 160 is integrated into the computer system 130.

A micro-Raman data acquisition unit 170 receives micro-Raman data relating to processed semiconductor wafers 105. The micro-Raman data relating to the processed semiconductor wafers 105 is described below. A correlator 180 then correlates the scatterometry data and the micro-Raman data for analysis by the system 100. The system 100 uses the correlated scatterometry and micro-Raman data and calculates stress levels on a plurality of portions of the semiconductor device 105 (or semiconductor wafer). The calculated stress levels can be used to perform adjustments in subsequent manufacturing processes to compensate for undesirable stress characteristics on the semiconductor wafer 105 that is being processed. The correlator 180 can be a software unit, a hardware unit, or a firmware unit. In one embodiment, the correlator 180 is integrated into the computer system 130.

Among the bases for modifying the control input signal on the line 123 are metrology measurements, inline and external measurement, and stress-level studies performed on the processed semiconductor wafers 105. The metrology measurements and stress level calculation are used to perform a feedback modification of the control input signals. In one embodiment, the feedback modification of the control input signals on the line 123 are performed on photolithography processes, such as line width adjustments using photo exposure dosages and line profile adjustments using exposure focus modifications. Feedback modification of the control input signal on the line 123 can also be performed on etch processes, such as etch line shape adjustments using etch recipe modifications.

In the context of a manufacturing process such as a stepper process, the control inputs on the line 123 that are used to operate the processing tool 120 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer 105 being processed in the exposure tool 120.

When a process step in the processing tool 120 is concluded, the semiconductor wafer that is being processed in the processing tool 120, in one embodiment, is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of the semiconductor wafer 105. In one embodiment, the amount of misregistration that occurred can be attributed to the control inputs to a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool and to reduce stress-induced errors on the semiconductor wafer.

In one embodiment of the present invention, a method and an apparatus are provided for utilizing scatterometry measurements and micro-Raman measurements to characterize various stress data points on the particular semiconductor wafer 105 that is being processed. Embodiments of the present invention provide for a method and apparatus for performing inline and real time evaluation of stress points on the semiconductor wafer 105 being processed. The present invention provides for acquiring scatterometry metrology data from the semiconductor wafers 105 that are being processed by the system 100.

Scatterometry metrology is a non-contact semiconductor wafer inspection technique used to acquire metrology data from the semiconductor wafer 105. Scatterometry measurements can be used for particle detection, estimation of particle sizing, and for roughness measurement of smooth silicon wafer surfaces. Scatterometry measurements are also useful for CMP roughness, and provides for characterization of several film parameters, such as film stress, and the like. Embodiments of the present invention also provide for examining Raman measurements in order to characterize semiconductor wafer parameters.

The Raman effect is a light scattering phenomenon that encompasses a beam of light or photons directed onto a semiconductor wafer. Impounding concentrated light or photons onto the semiconductor wafer causes a scattering of light beams that appears at wavelengths that are different from the original directed beam of light, such as a laser beam. The shifted wavelength of the scattered light can be analyzed to gain information regarding the semiconductor wafer. The frequency of the Raman phonon banded in silicon wafers is generally proportional to a region of stress on the wafers.

Due to the fact that mobility of charge carriers on a semiconductor wafer is affected by stress, knowing the stress levels on a semiconductor wafer can be useful in controlling manufacturing processes. The stress can be caused by geometrical features on a semiconductor wafer, which can be studied using Raman techniques. Raman studies can be characterized as a method of back scattering where an ion collector is used to collect back-scattering ions to study the parameters of the semiconductor wafer. Micro-Raman studies relate to the collecting and studying of ultra shallow reflectance of photons or back-scattering ions to characterize stress-levels, such as film stress, on a semiconductor wafer.

Figure 2:
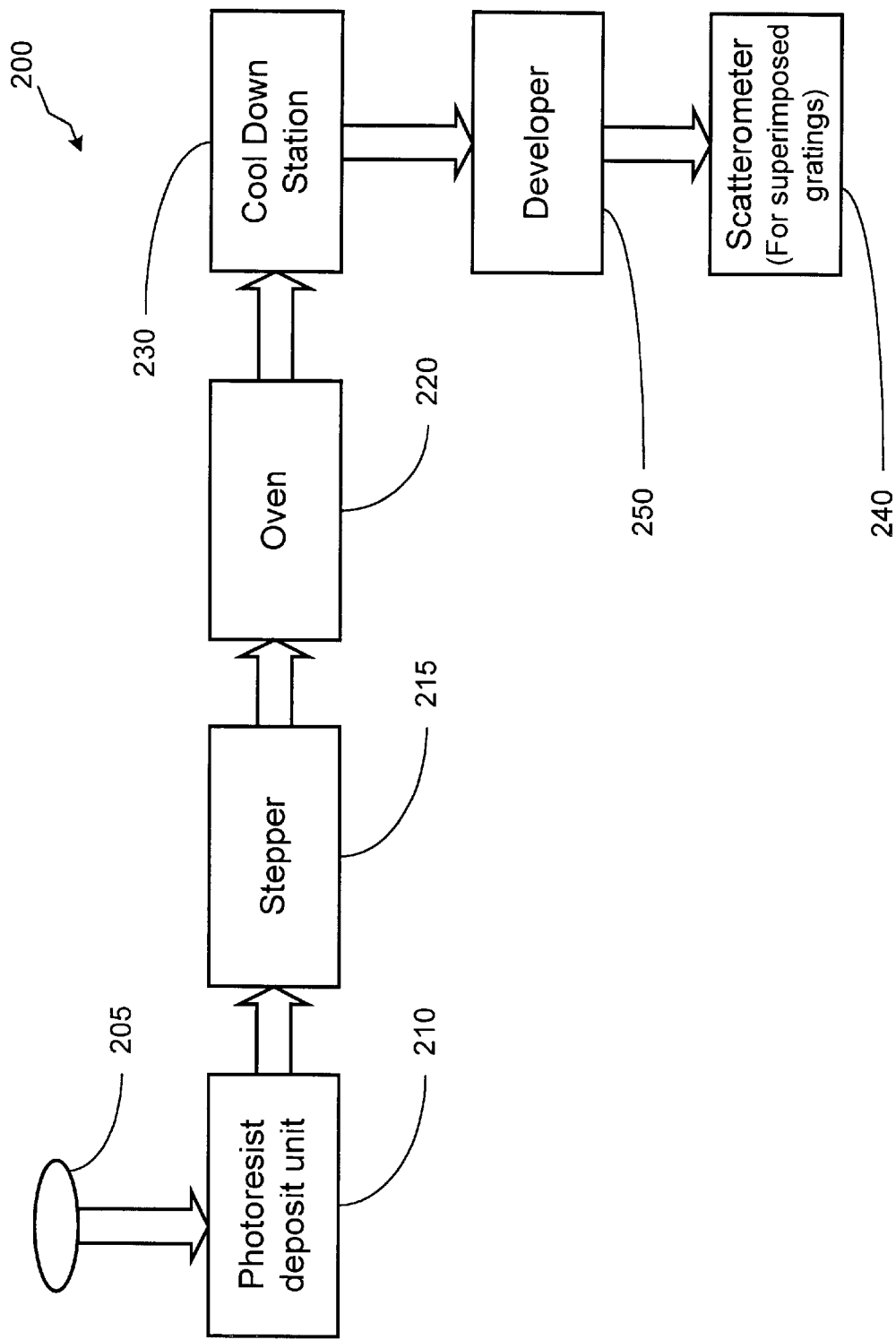
FIG. 2 illustrates a simplified diagram of a processing line for performing photolithography patterning.

Turning now to FIG. 2, one embodiment of an implementation of a scatterometry metrology sequence in the context of semiconductor wafer manufacturing, is illustrated. FIG. 2 shows a simplified diagram of an illustrative processing line 200 for performing photolithography patterning. The processing line 200 includes a photoresist deposition unit 210, a stepper 215, an oven 220, a cool down station 230, a developer 250, and a scatterometer 240. The photoresist deposition unit 210 receives a semiconductor wafer 205, and deposits a predetermined thickness of photoresist material upon the surface of the wafer 205. The stepper 215 then receives the wafer 205 (i.e., or lot of semiconductor wafers) and exposes the wafer 205 to a light source using a reticle to pattern the wafer 205. The wafer 205 is transferred to the oven 220, where a post exposure bake is conducted. Following the post exposure bake, the wafer 205 is transferred to the cool down station 230, and then to the developer 250 after the wafer 205 has sufficiently cooled. The developer 250 removes exposed photoresist material from the wafer 205.

The wafer 205 is then transferred to the scatterometer 240 for measurements. As described in greater detail below, the scatterometer 240 measures the wafer 205 to determine the acceptability and/or uniformity of the previously performed photolithography processes and conveys wafer measurements to the feedback/feed-forward controller 160. The computer system 130, which is integrated with the APC framework, based on the wafer measurements, adjusts the recipe of the stepper 215, as needed. As will be recognized by those of ordinary skill in the art in light of this disclosure, the processing line 200 may include discrete or integrated processing tools for performing the processing steps described herein. The data acquired by the scatterometer 240 is used for making modifications to the control input signals on the line 123, which control the processing tools 120.

Figure 3:
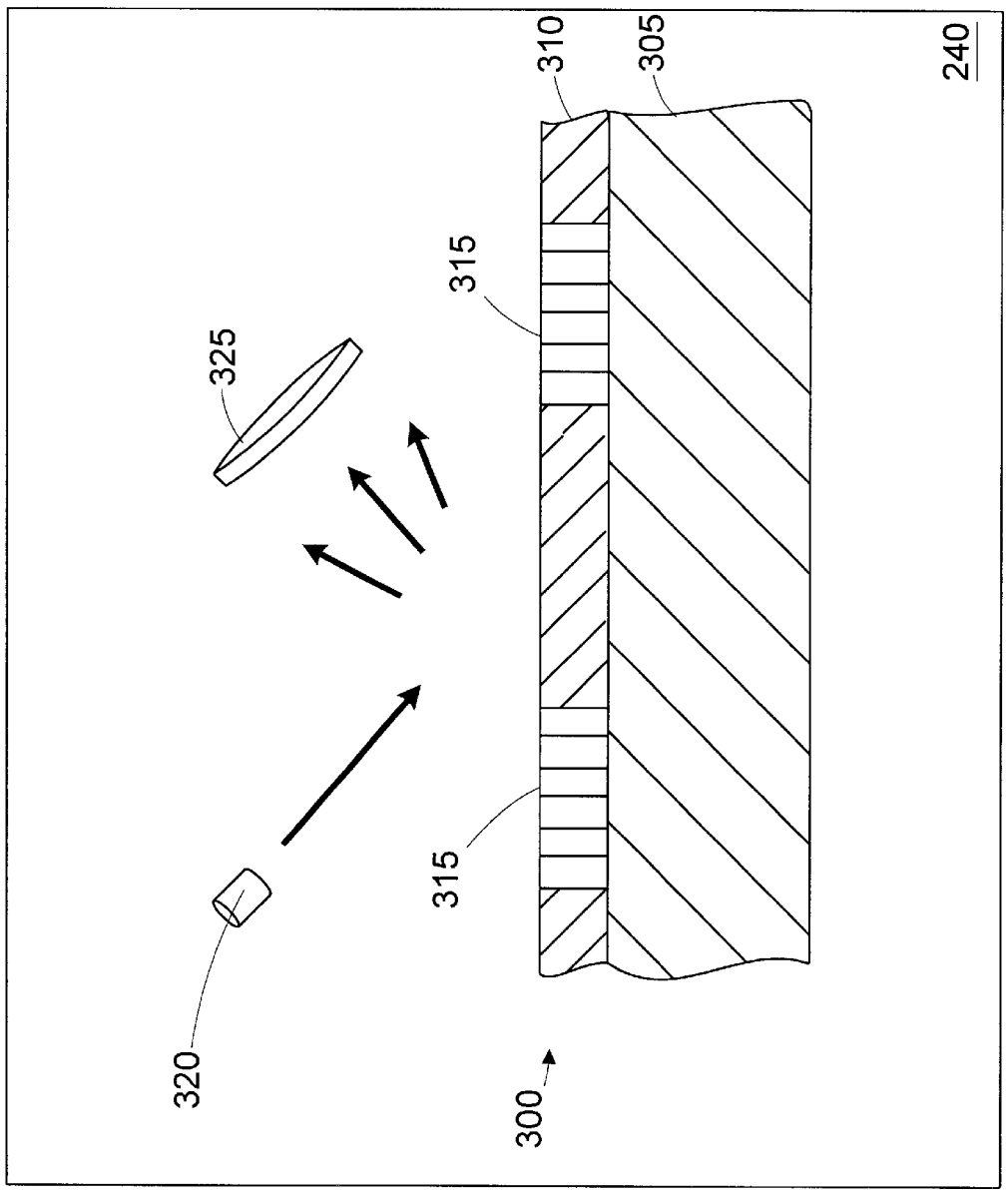
FIG. 3 illustrates a simplified view of a scatterometer with the semiconductor wafer loaded therein.

Referring to FIG. 3, a simplified view of the scatterometer 240 with the wafer 205 loaded therein is provided. The wafer 205 has a base material 305. The photoresist layer 310 has baked regions 315 formed on the base material 305 resulting from the previous exposure and baking steps (i.e., referred to as a patterned wafer 205). The chemical change resulting in the change in solubility of the baked regions 315 also results in the baked regions 315 having an index of refraction different than that of the unexposed portions of the photoresist layer 310.

In one embodiment, the scatterometer 240 comprises a light source 320 and a detector 325 positioned proximate the wafer 205. The light source 320 of the scatterometer 240 illuminates at least a portion of the wafer 205, and the detector 325 takes optical measurements, such as intensity, of the reflected light. Although the invention is described using a scatterometer 240 designed to measure reflected light intensity, it is contemplated that other measurement tools, such as an ellipsometer, a reflectometer, a spectrometer, or some other light-measuring device may be used. It is also contemplated that the scatterometer 240 may use monochromatic light, white light, or some other wavelength or combinations of wavelengths, depending on the specific implementation. The angle of incidence of the light may also vary, depending on the specific implementation.

The differences in the refractive indices for the baked regions 315 and the unexposed portions of the photoresist layer 310 cause light scattering, resulting in a decrease in the intensity of the reflected light as compared to scattering in the photoresist layer 310 before exposure and baking. The scatterometer 240 measures the intensity at different points on the wafer 205, such as on the periphery and in the middle. A difference in the light intensity between various points indicates a nonconformity, such as a variation in the line widths of the baked regions 315. The light analyzed by the scatterometer 240 typically includes a reflected component and a scattered component. The reflected component corresponds to the light component where the incident angle equals the reflected angle. The scattered component corresponds to the light component where the incident angle does not equal the reflected angle. For purposes of discussion hereinafter, the term "reflected" light is meant to encompass both the reflected component and the scattered component.

The computer system 130, in conjunction with the manufacturing model 140, adjusts the recipe of the stepper 215 to correct the nonconformity. For example, if the intensity measurement on the periphery of the wafer 205 is greater than the intensity measurement in the middle, the line width is presumably less, because a smaller line width causes less scattering. To correct the line width variation, the computer system 130 changes the recipe of the stepper 215 such that the exposure sites (e.g., individual die) with smaller line widths receive either an increased energy exposure or a longer duration exposure.

In an alternative embodiment, scatterometry measurements can be made before the implementation of the developer process. Detecting variations and adjusting the stepper 215 recipe prior to the developer 250 allows a quicker corrective action response. It is contemplated that all wafers 205 in a lot may be tested, or only selected wafers 205 in the lot. Identifying variations early allows correction of wafers 205 even in the same lot. For more stable steppers 215, the scatterometer 240 may be used only once per shift or once per week, depending on the specific implementation.

In the illustrated embodiment, the photoresist layer 310 is of a chemically-amplified type. In cases where a non-chemically-amplified photoresist material is used, the scatterometer 240 may be stationed prior to the oven 220. In a non-amplified photoresist system, the pattern is essentially complete after exposure in the stepper 215. The post exposure bake in the oven 220, which may be optional, is conducted to smooth the edges in the pattern resulting from standing waves, rather than to complete the patterning. Thus, the exposed portions already have an index of refraction different than the unexposed patterns, and the scatterometer 240 may be used. Scatterometry data is processed and correlated by the system 100. The scatterometry data is then analyzed by the scatterometry data analysis unit 160, which uses the scatterometry data to perform feedback control of subsequent processing of semiconductor wafers.

Figure 4:
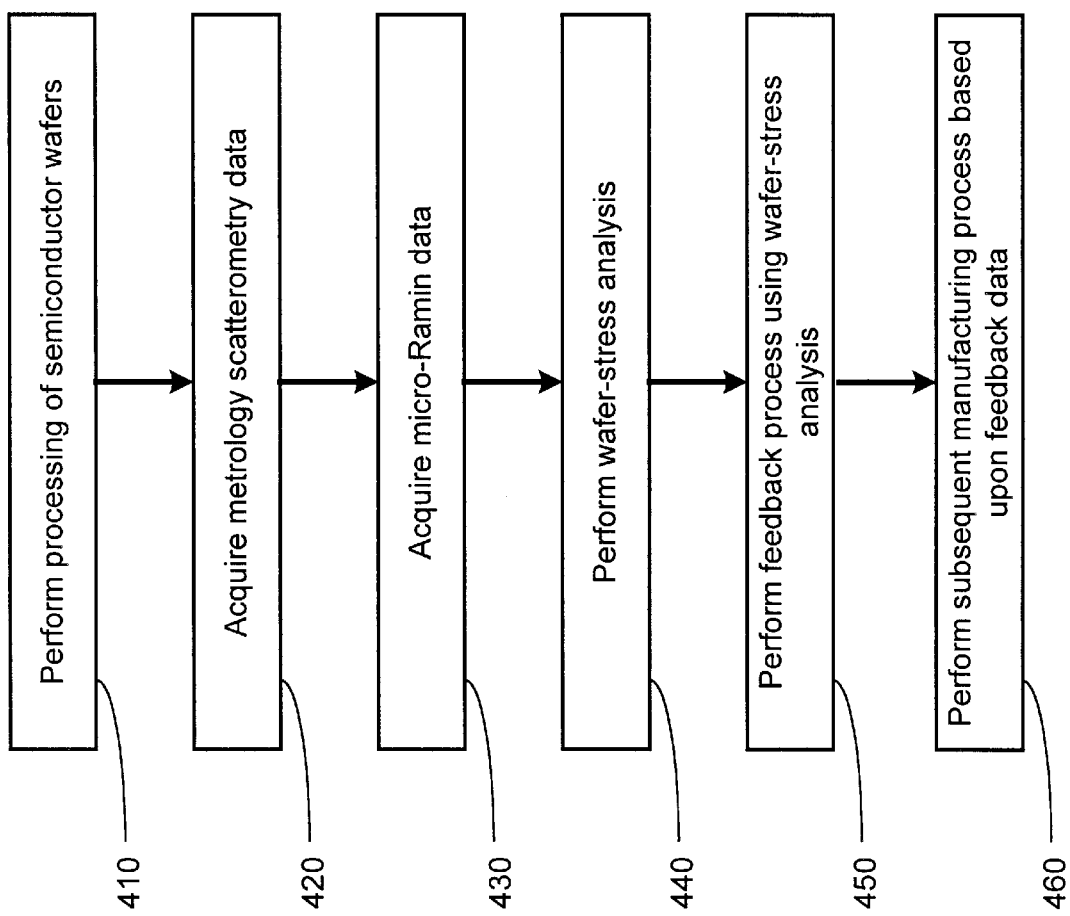
FIG. 4 illustrates a flowchart depiction of a method in accordance with one embodiment of the present invention.

Turning now to FIG. 4, a flowchart depiction of one embodiment of the method in accordance with the present invention is illustrated. A manufacturing lot of semiconductor wafers are processed (block 410). In one embodiment, a photolithography process is implemented. Once a semiconductor wafer is processed, scatterometry metrology data is acquired (block 420). The scatterometry metrology data is then analyzed and correlated with particular semiconductor wafers by the metrology data analysis unit 160. Upon completion of the semiconductor manufacturing processes, the semiconductor wafers are analyzed in order to acquire micro-Raman data (block 430). In one embodiment, micro-Raman data is acquired by the micro-Raman data acquisition unit 170 by techniques known to those skilled in the art.

Once the system 100 collects scatterometry metrology data and micro-Raman data, the system 100 performs an inline wafer stress analysis (block 440).

Figure 5:
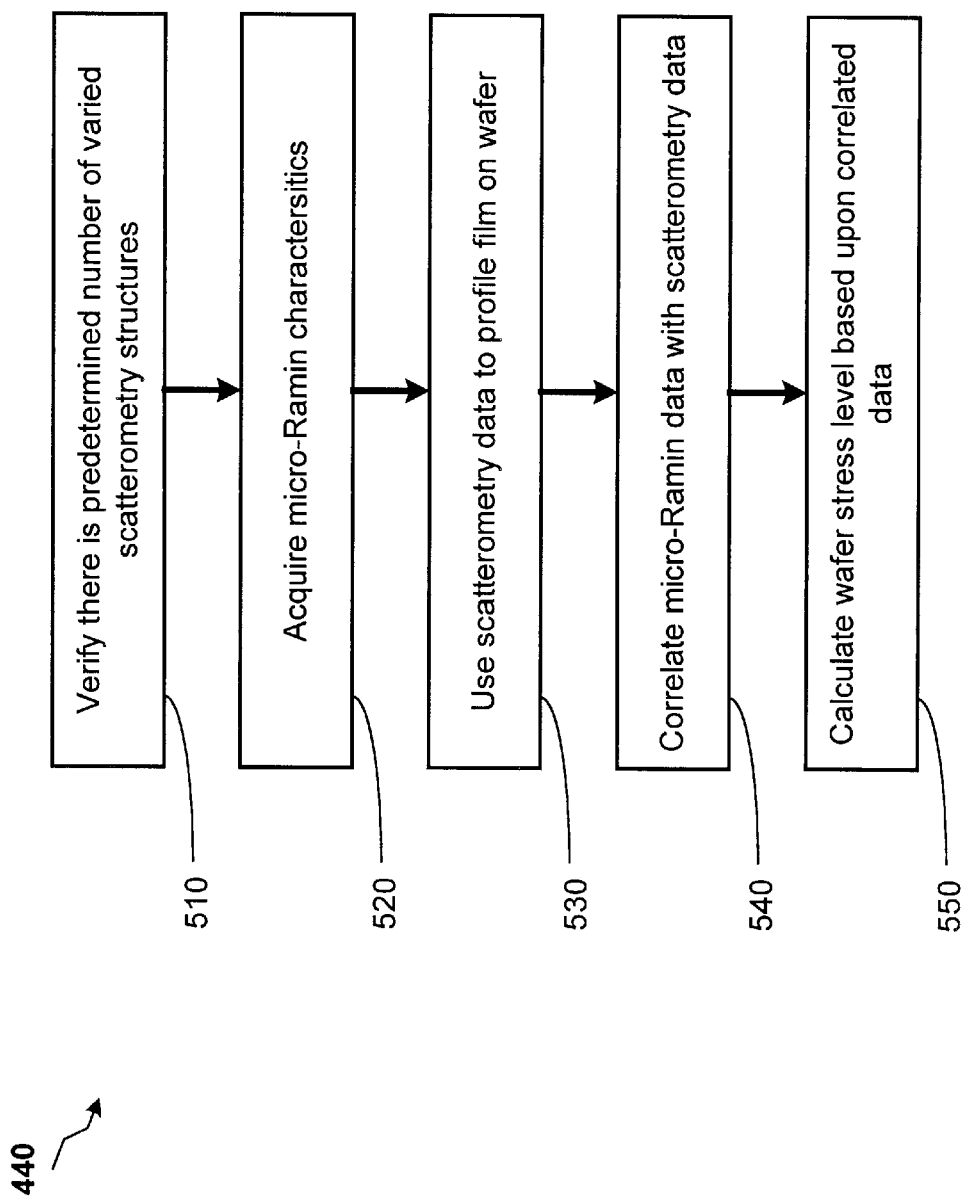
FIG. 5 illustrates a flowchart depiction of a method of performing an inline wafer-stress analysis, as described in FIG. 4, in accordance with one embodiment of the present invention.

Turning now to FIG. 5, a flowchart depiction of one embodiment of the steps for performing the inline wafer stress analysis described in block 440 of FIG. 4, is illustrated. In one embodiment, the system 100 verifies that there are a predetermined number of various scatterometry structures, or various pitches in the wafer-patterns, sufficient to perform the micro-Raman and the scatterometry studies (block 510). The system 100 acquires a micro-Raman data that has been analyzed, which characterizes the film stress characteristic of the semiconductor wafer (block 520). The system 100 then uses scatterometry data to profile the film characteristics on the semiconductor wafer (block 530). The system 100 then correlates the micro-Raman data with the scatterometry data (block 540). In other words, the system 100 finds corresponding semiconductor wafers, or locations on the semiconductor wafers, which relate to a particular micro-Raman data-acquisition study and a scatterometry data-acquisition study. In one embodiment, the correlator 180 performs the correlation function of consolidating the micro-Raman data and the scatterometry data.

Once the correlation functions described above are substantially complete, the system 100 calculates the stress level on all, or a portion, of the semiconductor wafer based upon the correlation data (block 550). A flowchart depiction of one embodiment of calculating the wafer stress level based upon the correlation data, as described by block 550, is illustrated in FIG. 6.

Figure 6:
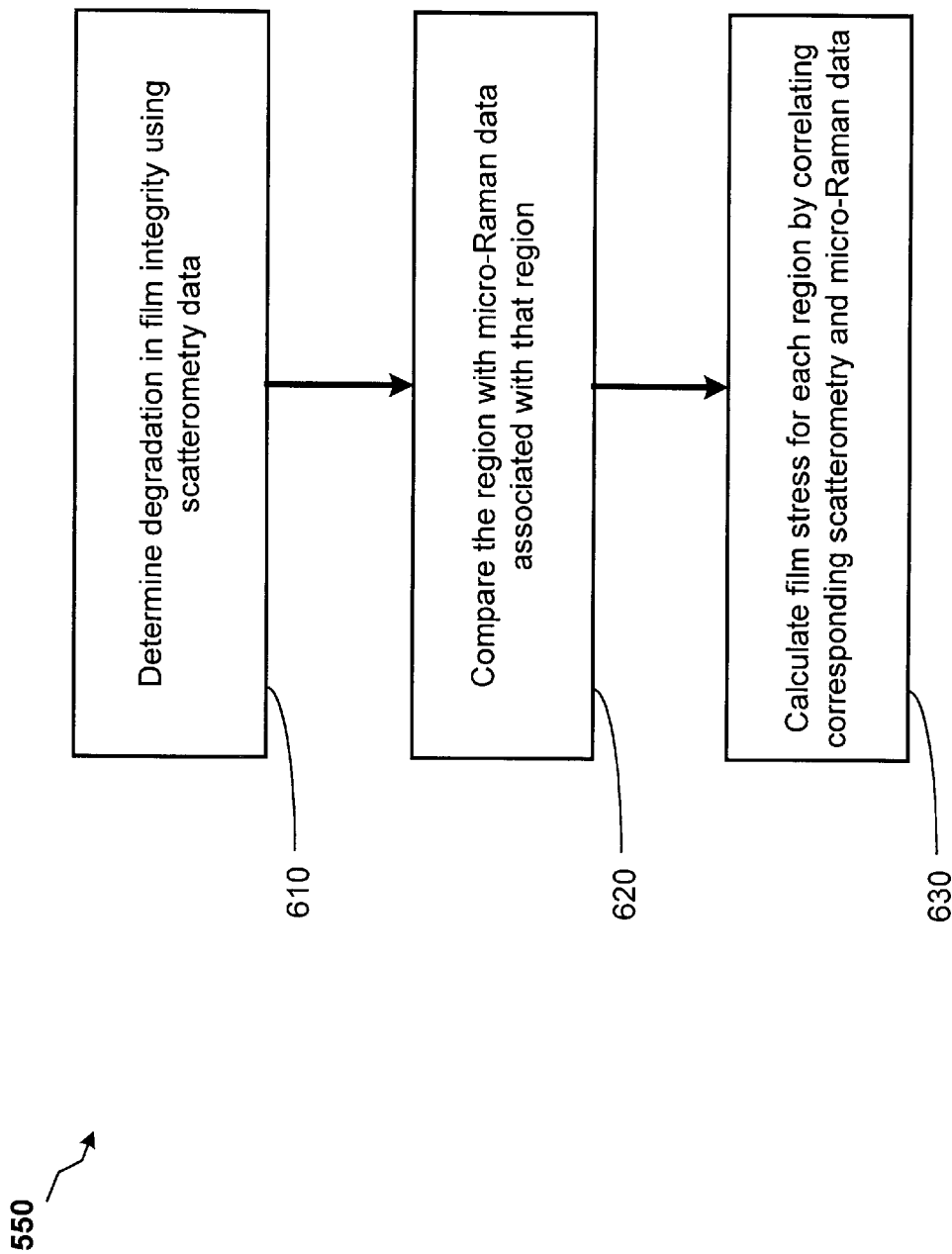
FIG. 6 illustrates a flowchart depiction of a method of performing a wafer stress-level calculation process, as described in FIG. 5, in accordance with one embodiment of the present invention.

Turning now to FIG. 6, the system 100 determines a degradation level in the film integrity of the semiconductor wafer using scatterometry data (610). In one embodiment the system 100 determines the film integrity, or the film stress level, on particular regions on the semiconductor wafer. The system 100 then compares that region with corresponding micro-Raman data acquired for the region (block 620). The system 100 then calculates the film stress level for each region by correlating corresponding scatterometry data and the micro-Raman data (block 630). In one embodiment, the film stress calculation, using the correlated scatterometry and micro-Raman measurements, can be performed by one skilled in the art that has the benefit of the present disclosure. In one embodiment, the film stress characteristics developed using embodiments of the present invention is performed in an inline matter. In other words, the film stress can be calculated during the processing of semiconductor wafers. Upon substantial completion of the steps described in FIG. 5 and FIG. 6, the steps of performing inline wafer stress analysis described in block 440 of FIG. 4 is essentially complete.

Figure 7:
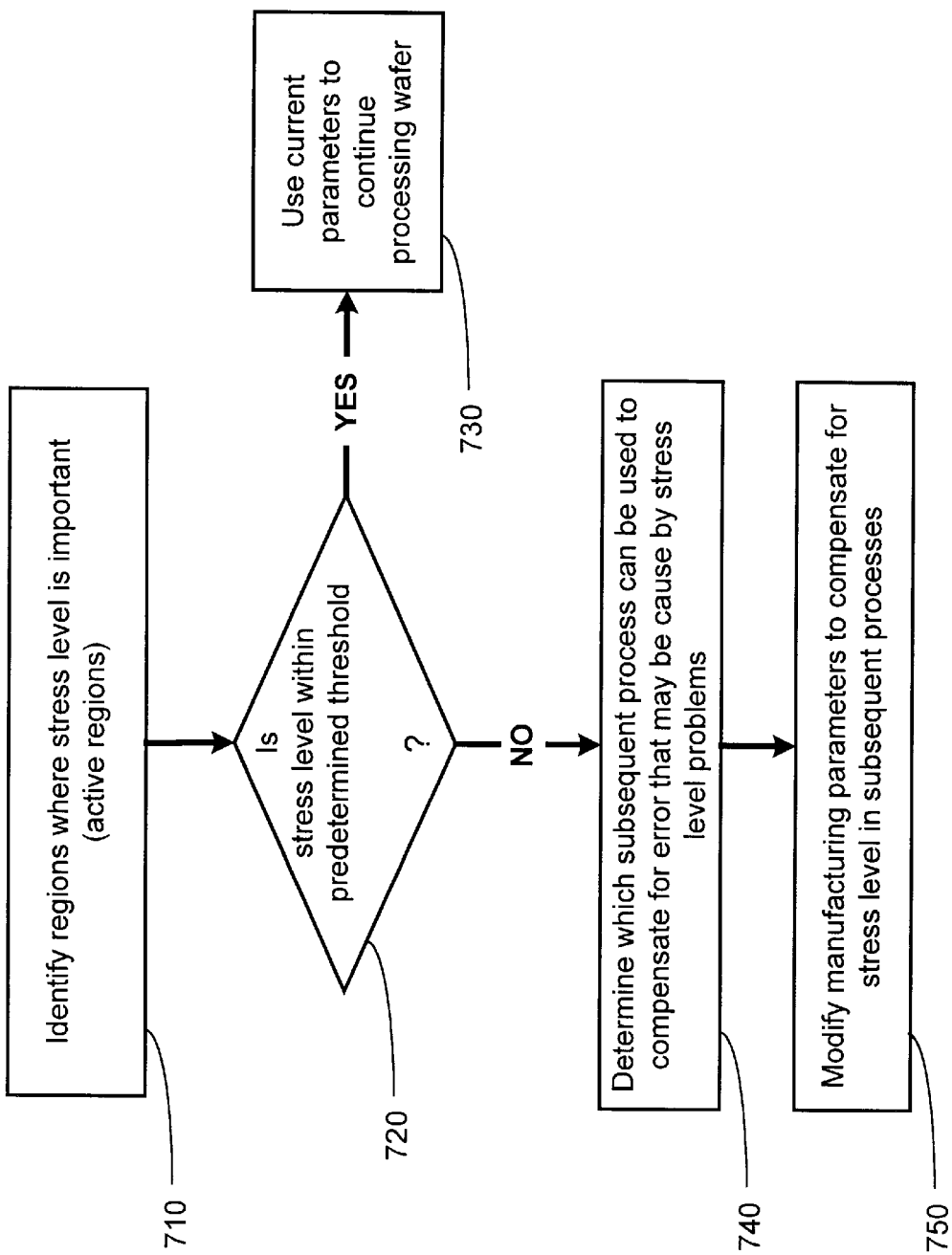
FIG. 7 illustrates a flowchart depiction of a method of performing a wafer stress-level feedback process, as described in FIG. 4, in accordance with one embodiment of the present invention.

Turning back to FIG. 4, the system 100 performs a feedback process using the film stress calculations performed by the system 100 (block 450). Feedback corrections that are made based upon errors or undesirable effects due the film stress level, can be used to compensate for wafer stress level problems in subsequent manufacturing processes. A flowchart depiction of one embodiment of performing the feedback process using wafer stress data in accordance with the present invention, is illustrated in FIG. 7.

The system 100 identifies regions on the semiconductor wafer where the film stress level is significant (block 710). Generally, film stress level is significant in active regions on the semiconductor wafer. Many times, film stress can modulate doped mobility, which in turn can affect drive currents in the circuitry on the semiconductor wafer. Therefore, different stress levels in different areas can cause an undesirably vast difference in drive currents. This can have the effect of a particular integrated circuit containing a plurality of threshold currents or voltages, which can be undesirable in semiconductor manufacturing.

Once the regions on the semiconductor wafer where stress level is significant (i.e., target regions) are identified, a determination is made whether the stress level in the target regions are within a predetermined specification (block 720). The predetermined specification can be calculated based upon ideal stress level predictions on a semiconductor wafer. The ideal stress level predictions can be determined by those skilled in the art that have benefit of the present application. The stress level specification can be calculated by those skilled in the art. When a determination is made that the stress level in the target regions of the semiconductor wafer is within predetermined specifications, the current parameters used to perform semiconductor manufacturing processes are used for subsequent processes (block 730).

When the system 100 determines that the stress level in a target region on the semiconductor wafer is not within an acceptable predetermined specification, a determination is made as to which subsequent process can be modified or adjusted in order to compensate for the stress level error on the semiconductor wafer (block 740). For example, subsequent to a photolithography process, when a determination is made that the film stress level is outside a predetermined specification, a subsequent etch process can be modified to compensate for the film stress level. For instance, during the subsequent etch process, the profile of a trench on the semiconductor wafer can be modified in order to compensate for the stress level error. As a further example, a stress level error causes by a photolithography process can be corrected by a subsequent photo-exposure process by adjusting an exposure-time parameter on the photolithography tool.

Once a determination is made as to which process is going to be modified to compensate for a film or a substrate stress level, at least one manufacturing parameter is adjusted to compensate for the stress level in a particular manufacturing process (block 750). The completion of the steps described in FIG. 7 substantially completes the feedback process using wafer stress data, described in block 450 of FIG. 4. Turning back to FIG. 4, once the feedback process using the wafer stress data is substantial complete, a subsequent wafer process is performed on the semiconductor wafer using the feedback data (block 460). The methods described in FIGS. 4–7 can be applied to a variety of semiconductor manufacturing processes. In an alternative embodiment, other types of metrology data can be utilized in conjunction with micro-Raman data to characterize stress levels on wafers. Furthermore, a variety of processes can be used to analyze and correct wafer film stress level or substrate stress level to produce a more robust processed semiconductor wafer.

The principles taught by the present invention can be implemented in an Advanced Process Control (APC) Framework. The APC is a preferred platform from which to implement the control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

processing at least one semiconductor device;

acquiring metrology data from said processed semiconductor device;

acquiring micro-Raman data relating to said processed semiconductor device; and performing a wafer-stress analysis based upon said metrology data and said micro-Raman data; and performing a feedback process based upon said wafer stress analysis.

2. The method described in claim 1, further comprising calculating at least one modified manufacturing parameter based upon said feedback process.

3. The method described in claim 1, wherein performing a process run of semiconductor devices further comprises processing semiconductor wafers.

4. The method described in claim 2, wherein processing semiconductor wafers further comprises performing a photolithography process on said semiconductor wafers.

5. The method described in claim 1, wherein acquiring metrology data from said processed semiconductor devices further comprises acquiring scatterometry data.

6. The method described in claim 1, wherein performing a wafer-stress analysis further comprises:

acquiring micro-Raman characteristics related to said semiconductor device;

using scatterometry data from said metrology data acquisition to profile a film on said semiconductor device;

correlating said micro-Raman characteristics and said scatterometry data; and calculating a wafer stress level based upon said correlated micro-Raman characteristics and scatterometry data.

7. The method described in claim 6, wherein correlating said micro-Raman characteristics and said scatterometry data comprises matching micro-Raman characteristic of a region on said semiconductor device with scatterometry data relating to said region.

8. The method described in claim 7, wherein calculating said wafer stress level based upon said correlated micro-Raman characteristics and scatterometry data comprises:
   determining a degradation in the integrity of said film within said region using said scatterometry data;
   comparing said data relating to the integrity of said film in said region with said micro-Raman characteristics relating to the region; and
   calculating a wafer stress for the region based upon said comparison.

9. The method described in claim 1, wherein performing a feedback process based upon said wafer stress analysis comprises:
   identifying at least active region on said semiconductor device;
   determining whether a stress level relating to said active region is within a predetermined threshold;
   identifying a manufacturing process for correcting said stress level in response to a determination the said stress level is outside said predetermined threshold; and
   modifying at least one manufacturing parameter of said manufacturing process to compensate for said stress level.

10. The method described in claim 9, wherein modifying at least one manufacturing parameter comprises modifying an etch rate parameter.

11. The method described in claim 9, wherein modifying at least one manufacturing parameter comprises modifying an exposure time period.

12. A system, comprising:
   a computer system;
   a manufacturing model coupled with said computer system, said manufacturing model being capable of generating and modifying at least one control input parameter signal;
   a machine interface coupled with said manufacturing model, said machine interface being capable of receiving process recipes from said manufacturing model;
   a processing tool capable of processing semiconductor wafers and coupled with said machine interface, said first processing tool being capable of receiving at least one control input parameter signal from said machine interface;
   a metrology tool coupled with said first processing tool and said second processing tool, said metrology tool being capable of acquiring metrology data;
   a metrology data analysis unit coupled with said metrology, said metrology data analysis unit being capable of organizing said acquired metrology data;
   a micro-Raman data acquisition unit coupled to said processing tool, said micro-Raman data acquisition unit being capable of acquiring micro-Raman data relating to said semiconductor wafers; and
   a correlator coupled to said micro-Raman data acquisition unit and said metrology data analysis unit, said correlator being capable of consolidating said metrology data and said micro-Raman data to perform a corrective feedback function for a manufacturing process based upon a wafer stress calculation performed using said consolidated data.

13. The apparatus of claim 12, wherein said computer system is capable of generating modification data for modifying at least one control input parameter in response to a determination that a significant error exists based upon said wafer stress calculation.

14. The apparatus of claim 13, wherein said manufacturing model is capable of modifying said control input parameter in response to said modification data.

15. The apparatus of claim 13, wherein said metrology tool is a scatterometer.

16. An apparatus, comprising:
   means for processing at least one semiconductor device;
   means for acquiring metrology data from said processed semiconductor device;
   means for acquiring micro-Raman data relating to said processed semiconductor device; and
   means for performing a wafer-stress analysis based upon said metrology data and said micro-Raman data; and
   means for performing a feedback process based upon said wafer stress analysis.

17. A computer readable program storage device encoded with instructions that, when executed by a computer, performs a method, comprising:
   processing at least one semiconductor device;
   acquiring metrology data from said processed semiconductor device;
   acquiring micro-Raman data relating to said processed semiconductor device; and
   performing a wafer-stress analysis based upon said metrology data and said micro-Raman data; and
   performing a feedback process based upon said wafer stress analysis.

18. The computer readable program storage device encoded with instructions that, when executed by a computer, performs the method described in claim 17, further comprising calculating at least one modified manufacturing parameter based upon said feedback process.

19. The computer readable program storage device encoded with instructions that, when executed by a computer, performs the method described in claim 17, wherein performing a process run of semiconductor devices further comprises processing semiconductor wafers.

20. The computer readable program storage device encoded with instructions that, when executed by a computer, performs the method described in claim 19, wherein processing semiconductor wafers further comprises performing a photolithography process on said semiconductor wafers.

21. The computer readable program storage device encoded with instructions that, when executed by a computer, performs the method described in claim 17, wherein acquiring metrology data from said processed semiconductor devices further comprises acquiring scatterometry data.

22. The computer readable program storage device encoded with instructions that, when executed by a computer, performs the method described in claim 17, wherein performing a wafer-stress analysis further comprises:
   acquiring micro-Raman characteristics related to said semiconductor device;
   using scatterometry data from said metrology data acquisition to profile a film on said semiconductor device;
   correlating said micro-Raman characteristics and said scatterometry data; and
   calculating a wafer stress level based upon said correlated micro-Raman characteristics and scatterometry data.

23. The computer readable program storage device encoded with instructions that, when executed by a computer, performs the method described in claim 22, wherein correlating said micro-Raman characteristics and said scatterometry data comprises matching micro-Raman characteristic of a region on said semiconductor device with scatterometry data relating to said region.

24. The computer readable program storage device encoded with instructions that, when executed by a computer, performs the method described in claim 23, wherein calculating said wafer stress level based upon said correlated micro-Raman characteristics and scatterometry data comprises:

determining a degradation in the integrity of said film within said region using said scatterometry data;

comparing said data relating to the integrity of said film in said region with said micro-Raman characteristics relating to the region; and calculating a wafer stress for the region based upon said comparison.

25. The computer readable program storage device encoded with instructions that, when executed by a computer, performs the method described in claim 17, wherein performing a feedback process based upon said wafer stress analysis comprises:

identifying at least active region on said semiconductor device;

determining whether a stress level relating to said active region is within a predetermined threshold;

identifying a manufacturing process for correcting said stress level in response to a determination the said stress level is outside said predetermined threshold; and modifying at least one manufacturing parameter of said manufacturing process to compensate for said stress level.

26. The computer readable program storage device encoded with instructions that, when executed by a computer, performs the method described in claim 25, wherein modifying at least one manufacturing parameter comprises modifying an etch rate parameter.

27. The computer readable program storage device encoded with instructions that, when executed by a computer, performs the method described in claim 25, wherein modifying at least one manufacturing parameter comprises modifying an exposure time period.

28. A method, comprising:

processing at least one semiconductor device;

acquiring scatterometry data from said processed semiconductor device;

acquiring micro-Raman data relating to said processed semiconductor device; and performing a wafer-stress analysis based upon said metrology data and said micro-Raman data; and performing a feedback process based upon said wafer stress analysis.

29. The method described in claim 28, further comprising calculating at least one modified manufacturing parameter based upon said feedback process.

30. The method described in claim 28, wherein performing a process run of semiconductor devices further comprises processing semiconductor wafers.

31. The method described in claim 29, wherein processing semiconductor wafers further comprises performing a photolithography process on said semiconductor wafers.

32. The method described in claim 28, wherein performing a wafer-stress analysis further comprises:

acquiring micro-Raman characteristics related to said semiconductor device;

using scatterometry data from said scattermetry data acquisition to profile a film on said semiconductor device;

correlating said micro-Raman characteristics and said scatterometry data; and calculating a wafer stress level based upon said correlated micro-Raman characteristics and scatterometry data.

33. The method described in claim 32, wherein correlating said micro-Raman characteristics and said scatterometry data comprises matching micro-Raman characteristic of a region on said semiconductor device with scatterometry data relating to said region.

34. The method described in claim 33, wherein calculating said wafer stress level based upon said correlated micro-Raman characteristics and scatterometry data comprises:

determining a degradation in the integrity of said film within said region using said scatterometry data;

comparing said data relating to the integrity of said film in said region with said micro-Raman characteristics relating to the region; and calculating a wafer stress for the region based upon said comparison.

35. The method described in claim 28, wherein performing a feedback process based upon said wafer stress analysis comprises:

identifying at least active region on said semiconductor device;

determining whether a stress level relating to said active region is within a predetermined threshold;

identifying a manufacturing process for correcting said stress level in response to a determination the said stress level is outside said predetermined threshold; and modifying at least one manufacturing parameter of said manufacturing process to compensate for said stress level.

36. The method described in claim 35, wherein modifying at least one manufacturing parameter comprises modifying an etch rate parameter.

37. The method described in claim 35, wherein modifying at least one manufacturing parameter comprises modifying an exposure time period.

\* \* \* \* \*